United States Patent [19]
Babineau

[11] Patent Number: 6,135,793
[45] Date of Patent: Oct. 24, 2000

[54] COUPLER FOR GROUNDING OF A MODULAR TRANSCEIVER HOUSING

[75] Inventor: Paul J. Babineau, Ashburnham, Mass.

[73] Assignee: 3Com Corporation, Santa Clara, Calif.

[21] Appl. No.: 09/383,713

[22] Filed: Aug. 26, 1999

[51] Int. Cl.⁷ ..................................................... H01R 4/66
[52] U.S. Cl. .............................. 439/92; 439/95; 439/101; 361/753; 361/799
[58] Field of Search .............................. 439/92, 95, 101, 439/108, 64; 361/753, 799, 800, 816, 818; 174/51

[56] References Cited

U.S. PATENT DOCUMENTS

| | | | |
|---|---|---|---|
| 5,747,735 | 5/1998 | Chang et al. | 439/95 |
| 5,752,841 | 5/1998 | Hori | 439/108 |
| 5,879,173 | 3/1999 | Poplawski et al. | 439/92 |
| 5,906,496 | 5/1999 | DelPrete et al. | 439/95 |

Primary Examiner—Paula Bradley
Assistant Examiner—Katrina Davis
Attorney, Agent, or Firm—Weingarten, Schurgin, Gagnebin & Hayes LLP

[57] ABSTRACT

A resilient conductive coupler electrically couples a conductive housing of a modular transceiver to ground contacts of a printed circuit board. A transceiver carrier is mounted to a printed circuit board and the resilient conductive coupler is selectively positioned and mounted to the printed circuit board so as to make a low impedance electrical connection with ground contact pads of the printed circuit board. The resilient conductive coupler is sized and positioned such that a portion of the coupler wipes the conductive housing of the transceiver as the transceiver is slidably inserted into the carrier. The coupler electrically couples the conductive housing of the modular transceiver to the ground contact of the printed circuit board when the modular transceiver is seated within the carrier so as to minimize undesired emissions from the modular transceiver when the transceiver is operable.

13 Claims, 3 Drawing Sheets

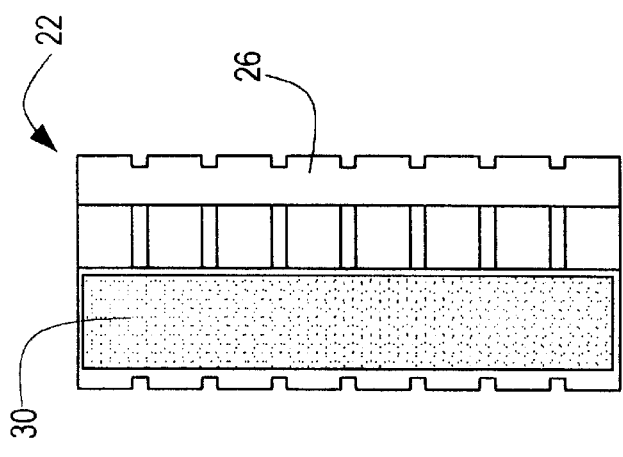
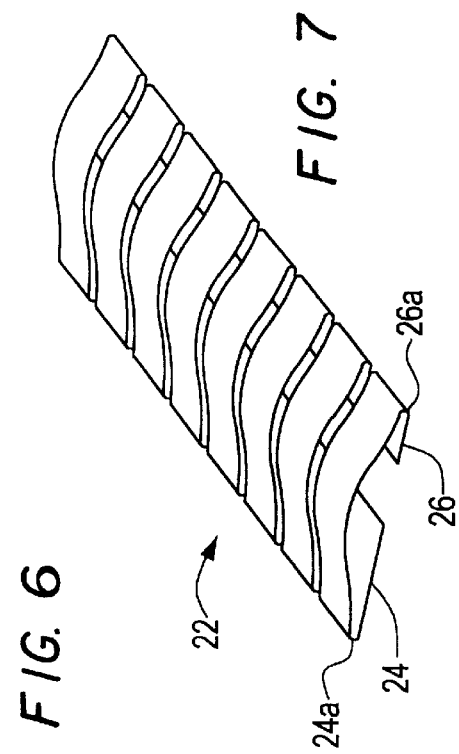
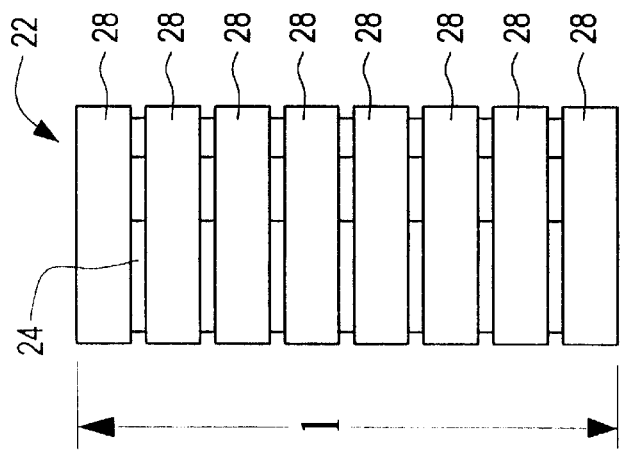

COUPLER FOR GROUNDING OF A MODULAR TRANSCEIVER HOUSING

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates to a method and apparatus for minimizing electromagnetic interference (EMI) and radio-frequency interference (RFI) and more particularly to a resilient conductive coupler for electrically coupling a conductive housing of a modular transceiver to at least one ground contact of a printed circuit board.

Modular transceivers, such as Gigabit Interface Converters (GBICs) are employed to interface communication links to port logic within telecommunication devices. A modular transceiver includes input and output ports for connection of electronics within the transceiver housing to electrical or optical communication links. Additionally, the modular transceiver includes a transceiver interface connector. Typically, modular transceivers are mounted within a transceiver carrier which is sized and configured to receive the transceiver. More specifically, the transceiver carrier includes an interface connector and the transceiver is slideably disposed and seated within the carrier such that contacts of the transceiver connector mate with corresponding contacts of the carrier interface connector when the transceiver is seated within the carrier. The transceiver carrier is adapted for mounting to a printed circuit board. The carrier connector includes electrical leads which make contact between contacts of the carrier connector and conductive paths on the printed circuit board when mounted on printed circuit card.

It is well known that the operation of high-speed transceivers can produce undesirable EMI/RFI. To minimize EMI/RFI emissions, commercially available modular transceivers are typically provided with a conductive housing. The connection of the conductive housing of a modular transceiver via a reliable low impedance contact can be problematic in view of the fact that the transceivers are slideably installed within the carrier and must be able to be removed from the carrier. One technique for coupling the conductive housing of an optical transceiver to a bulkhead is disclosed in U.S. application Ser. No. 09/200,883 filed on Nov. 30, 1998, which application is owned by the assignee of the present invention. The coupler therein disclosed is intended for mounting within an opening within a bulkhead and couples the transceiver to the bulkhead. Additionally, the coupler therein disclosed is particularly sized for the corresponding bulkhead opening and the transceiver intended to extend through the coupler.

It would be therefore be desirable to provide a reliable mechanism for conductively coupling the conductive housing of a modular transceiver with a ground contact of a printed circuit board on which the associated carrier is mounted to minimize EMI/RFI emissions. It would further be desirable to provide such a mechanism in a low cost manner which does not interfere with the removeability of the modular transceiver from the associated carrier.

BRIEF SUMMARY OF THE INVENTION

In accordance with the present invention, a resilient conductive coupler is provided for coupling a conductive housing of a modular transceiver to at least one ground contact on a printed circuit board when the transceiver is installed within a transceiver carrier. The transceiver carrier is mounted to a printed circuit board. A resilient conductive coupler is selectively positioned and mounted to the printed circuit board so as to make a low impedance electrical connection with the at least one ground contact on the printed circuit board. The coupler is sized and positioned such that a portion of the coupler wipes a side of the transceiver housing adjacent the printed circuit board as the transceiver is slideably inserted into the carrier and is urged into conductive contact with the side of the housing when the transceiver is seated within the carrier. In the foregoing manner a low impedance conductive path is formed between the conductive housing of the transceiver and the at least one ground contact of the printed circuit board.

BRIEF DESCRIPTION OF THE SEVERAL VIEWS OF THE DRAWING

The invention will be more fully understood by reference to the following detailed description in conjunction with the drawing of which:

FIG. 4 is a top view of the coupler depicted in FIG. 1;

FIG. 5 is a side view of the coupler depicted in FIG. 1;

FIG. 6 is a bottom view of the coupler depicted in FIG. 1; and

FIG. 7 is a perspective view of the coupler depicted in FIG. 1.

DETAILED DESCRIPTION OF THE INVENTION

Figure 1:
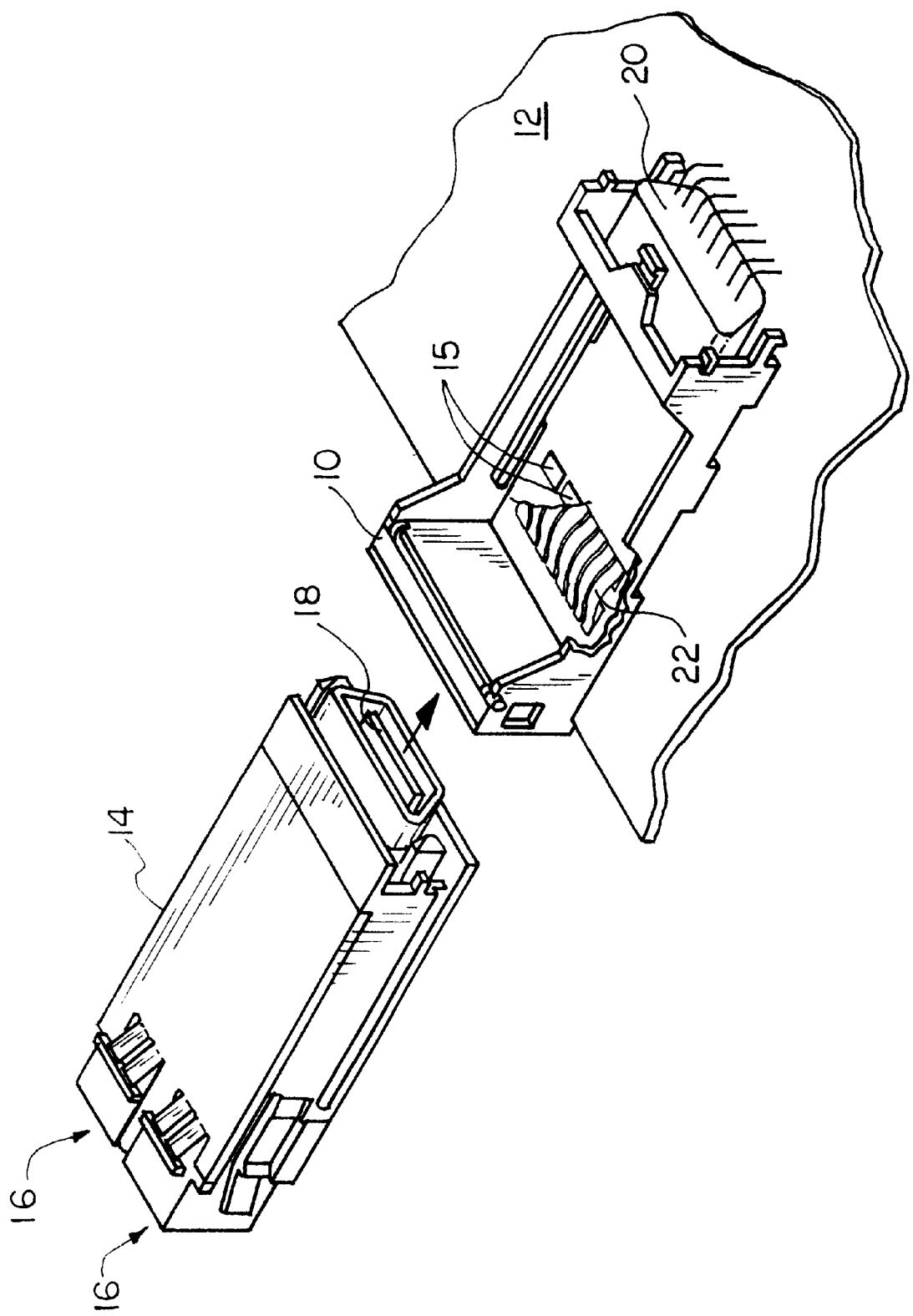
FIG. 1 is a perspective view illustrating a modular transceiver, a transceiver carrier mounted to a printed circuit board and a resilient conductive coupler for electrically coupling the transceiver to the printed circuit board in accordance with the present invention, wherein the transceiver is illustrated prior to seating of the transceiver within the carrier.

In accordance with the present invention, a method and apparatus for providing a low impedance electrical path between a conductive housing of a modular transceiver and at least one ground contact of a printed circuit board is disclosed. Referring to FIG. 1, a modular transceiver carrier 10 is illustrated mounted to a printed circuit board 12 which is mounted within a telecommunications device. The modular transceiver carrier 10, is sized and configured to receive a modular transceiver 14, such as a Gigabit Interface Converter (GBIC) as known in the art. For example, the carrier 10 may comprise a GBIC carrier such a part number 787663 which is commercially available from AMP Incorporated of Harrisburg, Pa. and the modular transceiver may comprise a GBIC transceiver such as Model No. FTR-1319-5a commercially available from Finisar Corporation of Mountain View, Calif. The modular transceiver 14 has a conductive housing and includes send and receive ports 16 for coupling electrical or optical communication links, as applicable, to the transceiver electronics within the transceiver housing.

Additionally, the modular transceiver includes a transceiver connector 18, for mating with a cooperative connector 20 of the transceiver carrier 10. The transceiver housing, includes first and second conductive sides, a top side and a bottom side. The bottom side of the housing is located a predetermined distance from the surface of the printed circuit board when the modular transceiver 14 is seated within the carrier 10. The modular transceiver 14 is illustrated in FIG. 1 prior to installation and seating of the transceiver 14 in the carrier 10. The modular transceiver is illustrated as being seated within the carrier 10 in FIG. 2. A side cross-sectional view of the assembly is illustrated in FIG. 3.

Figure 2:
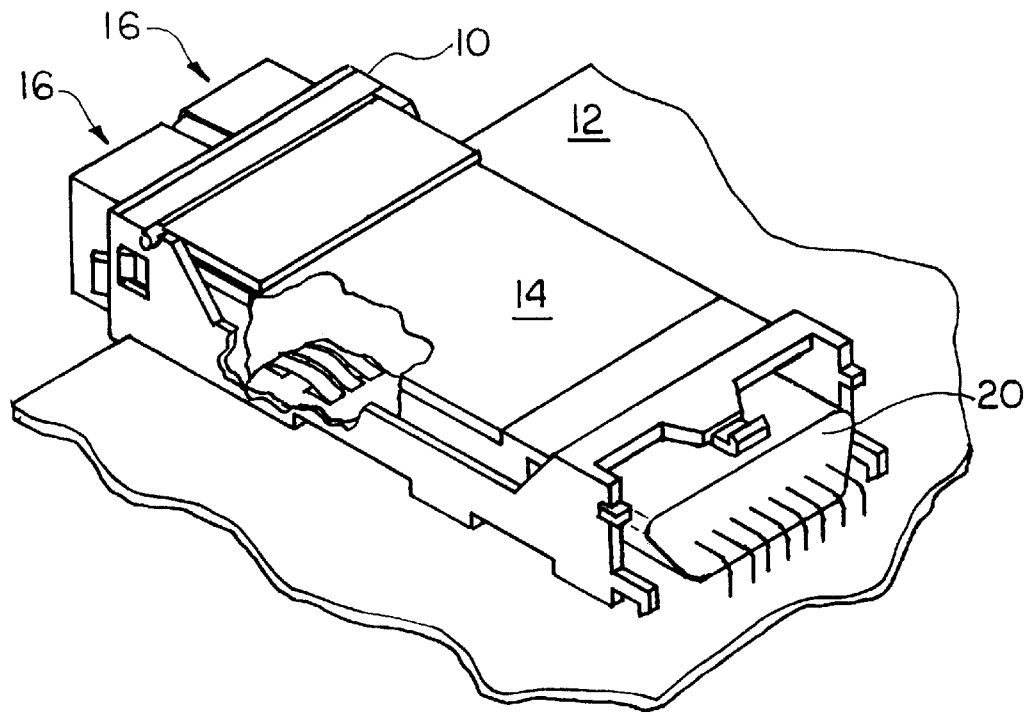
FIG. 2 is a perspective cutaway view illustrating a modular transceiver, a transceiver carrier mounted to a printed circuit board and a conductive coupler for electrically coupling the transceiver to the printed circuit board in accordance with the present invention wherein the transceiver is illustrated after seating of the transceiver within the carrier.
Figure 3:
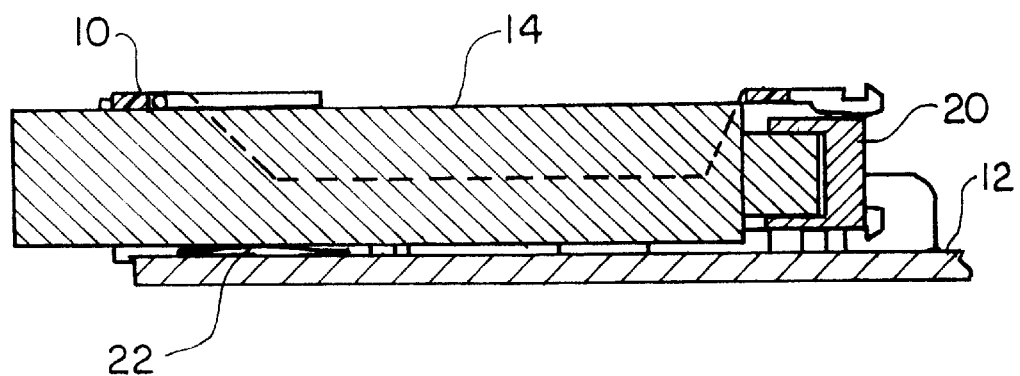
FIG. 3 is a side cross-sectional view of the assembly depicted in FIG. 2.

Referring to FIGS. 1, 2 and 3, a resilient conductive coupler 22 is mounted to the printed circuit board 12 within a footprint defined by the carrier 10. More specifically, the printed circuit board includes at least one ground contact 15 which is coupled to the grounding within the printed circuit board and the associated telecommunications device. The ground contacts on the printed circuit board 12 may comprise a single ground contact pad or an array or pads. The coupler 22 includes a a base portion and is mounted to the printed circuit board such that the base portion of the conductive coupler 22 abuts and is electrically coupled to at least one ground contact 15 of the printed circuit board 12. In this manner a low impedance electrical connection is provided between the coupler and the ground contact of the printed circuit board 12.

The coupler 22 is illustrated in greater detail in FIGS. 4–7. The coupler 22 is fabricated as an integrally formed sheet metal strip. In a preferred embodiment, the coupler comprises a predetermined length of Low Profile Stick-On Mounting, such as Model 125LP45, which is commercially available from Tech-Etch, Inc. of Plymouth, Mass. The Stick-On Mounting includes an adhesive (3M F9469PC) on the underside of the Mounting for mounting the device to an intended mounting surface. While the coupler 22 may be fabricated of any suitable conductive material, the Low Profile Stick-On Mounting referenced above, is fabricated of Beryllium Copper and has a bright tin coating.

The coupler 22 includes a first base portion 24 having a leading edge 24*a*, and a second base portion 26 having a trailing edge 26*a*. A plurality of curvelinear connecting members 28 extend between the leading edge 24*a* of the first base portion 24 and the trailing edge 26*a* of the second base portion 26. As described above, an adhesive 30 is provided on the bottom side of the first base portion 24 of the coupler. The adhesive 30 serves to adhere the coupler 22 to the printed circuit board 12 as depicted in FIG. 1.

The second base portion is disposed in conductive contact with the at least one ground contact on the printed circuit board when the coupler is adhered to the printed circuit board via the adhesive 30.

The coupler 22 has a height "h" which is specified in an undeformed state so as to be greater than the distance between the printed circuit board 12 and the bottom side of the transceiver 14 when the transceiver 14 is seated within the carrier 10. Accordingly, when the transceiver 14 is slideably disposed in the carrier 10, the curvelinear connecting members 28 of the coupler 22 deform, wipe the bottom side of the conductive housing of the transceiver 14 and are urged into conductive contact with the housing. In this manner, when the transceiver is installed within the housing as illustrated in FIG. 3, the coupler 22 electrically couples the conductive housing 14 to the at least one conductive ground pad on the printed circuit board 12.

The coupler is mounted to the printed circuit card 12 within the footprint of the carrier 10 such that the length "1" of the coupler 22 extends generally transverse to the direction of transceiver 14 travel during slideable insertion of the transceiver into the carrier. This orientation facilitates the wiping action which promotes a good electrical contact between the coupler and the housing. While the preferred coupler is shown as being mounted to the printed circuit card via use of an adhesive, it should be appreciated that any suitable mounting technique may be employed which results in the contact base portion of the coupler being in electrical communication with the at least one ground pads of the printed circuit board when the coupler is fixed in its mounting position. Additionally, while a commercially available Stick-On Mounting has been employed for the coupler 22, any suitable resilient conductive coupler which serves to couple the transceiver to the ground pads on the printed circuit board 12 may also be used. Moreover, while the preferred embodiment of the coupler includes first and second base portions connected by a plurality of curvelinear connecting members, it should be appreciated that the coupler may include a single base portion and may include one or more non-curvelinear connecting members which extend from the base portion for coupling to the housing.

The coupler is provided with plural curvelinear connecting members 28 between the first and second base portions to assure a good low impedance contact between the coupler and the transceiver 14. Since the respective curvelinear connecting members 28 can flex independently of the other members, should a particle lodge between one of the curvelinear connecting members 28 and the bottom side of the housing of the transceiver 14, or in the event of an irregularity in the surface of the bottom side of the housing, unaffected curvelinear connecting members 28 will still make a good large area electrical contact with the housing.

In the foregoing manner, a system is provided for conductively coupling the conductive housing of a modular transceiver to ground contacts of a printed circuit board so as to minimize EMI/RFI emissions from the transceiver when the transceiver seated within the carrier and operable. It will be appreciated by those of ordinary skill in the art that variations to and modifications of the above describes methods and apparatus for coupling a modular transceiver to ground contacts of a printed circuit board may be made without departing from the inventive concepts described herein. Accordingly, the invention should be viewed as limited solely by the scope and spirit of the appended claims.

What is claimed is:

1. An apparatus for grounding a conductive housing of an electronic module having a conductive housing bottom surface, wherein said apparatus is employed within an electronic device, said apparatus comprising:

a printed circuit board;

a carrier adapted to receive said electronic module, said carrier mounted on said printed circuit board and defining a carrier footprint on said printed circuit board, said printed circuit board having at least one conductive contact selectively positioned within said footprint, said at least one contact being in electrical communication with a ground path; and a conductive coupler mounted to said printed circuit board in a predetermined coupler mounting location within said carrier footprint, said coupler being electrically coupled to said at least one conductive contact and having a predetermined height with respect to said printed circuit board, said predetermined location and said coupler height being specified such that said conductive housing bottom surface of said electronic module abuts said conductive coupler when said electronic module is installed in a module mounting position within said carrier so as to conductively couple said electronic module housing to said ground path in electrical communication with said at least one contact.

2. The apparatus of claim 1 wherein said conductive coupler comprises:

a first conductive base portion;

a second conductive base portion; and at least one conductive housing contact member mechanically and electrically coupling said first and second conductive base portions and extending said predetermined height above the printed circuit board when said coupler is mounted to said printed circuit board in said coupler mounting location.

3. The apparatus of claim 2 wherein said conductive coupler includes a plurality of conductive housing contact members integral with said first and second conductive base portions and wherein said plurality of housing contact members extends above said printed circuit board approximately by said predetermined height when said conductive coupler is mounted to said printed circuit board in said coupler mounting location.

4. The apparatus of claim 2 wherein said printed circuit board includes a plurality of conductive contacts disposed on said printed circuit board within said footprint, said plurality of conductive contacts being electrically coupled to said ground path and being electrically coupled to said first conductive base portion when said coupler is mounted to said printed circuit board in said coupler mounting location.

5. The apparatus of claim 1 wherein said electronic module is a modular transceiver and said carrier comprises a transceiver carrier sized and configured to receive said modular transceiver.

6. The apparatus of claim 5 wherein said modular transceiver is a Gigabit Interface Converter and said transceiver carrier is sized and configured to receive said Gigabit Interface Converter.

7. A method for conductively coupling a conductive housing of an electronic module to at least one conductive contact of a printed circuit board wherein said conductive housing has a conductive bottom surface, said method comprising the step of:

inserting said electronic module into a carrier mounted on said printed circuit board, conductively coupling said conductive bottom surface of said housing to said at least one conductive contact through a conductive coupler in electrical communication with and abutting both said conductive bottom surface and said at least one conductive contact following said inserting step.

8. The method of claim 7 wherein said conductively coupling step comprises the step of:

conductively coupling said conductive bottom surface to said at least one conductive contact through said conductive coupler wherein said conductive coupler comprises an integral conductive structure having at least one base portion in electrical communication with said at least one contact and at least one conductive contact member extending above said printed circuit board and abutting said conductive bottom surface following said inserting step.

9. The method of claim 8 wherein said conductive coupler includes a plurality of conductive members integral with said at least one base portion.

10. The method of claim 8 wherein said inserting step further comprises the step of slideably disposing said electronic module into said carrier.

11. The method of claim 10 wherein said slideably disposing step further comprises the step of wiping said conductive bottom surface against said at least one conductive member during said slideably disposing step.

12. The method of claim 11 wherein said inserting step further includes the step of deforming said at least one conductive member during the insertion of said electronic module into said carrier such that said at least one conductive member is urged into conductive contact with the bottom surface of said housing.

13. The method of claim 12 wherein said coupler has an undeformed height above said printed circuit board prior to insertion of said electronic module within said carrier and said deforming step further comprises the step of:

compressing said at least one conductive member during said inserting step such that said coupler has a height above said printed circuit board less than said undeformed height following insertion of said electronic module into said carrier.

* * * * *